United States Patent [19]
Wojnarowski et al.

[11] Patent Number: 5,331,203
[45] Date of Patent: Jul. 19, 1994

[54] HIGH DENSITY INTERCONNECT STRUCTURE INCLUDING A CHAMBER

[75] Inventors: Robert J. Wojnarowski, Ballston Lake; Charles W. Eichelberger, Schenectady; William P. Kornrumpf, Albany, all of N.Y.

[73] Assignee: Generla Electric Company, Schenectady, N.Y.

[21] Appl. No.: 141,460

[22] Filed: Oct. 25, 1993

Related U.S. Application Data

[63] Continuation of Ser. No. 504,770, Apr. 5, 1990, abandoned.

[51] Int. Cl.⁵ .................... H01L 23/02; H01L 23/12
[52] U.S. Cl. .................... 257/698; 257/687; 257/689; 257/700; 257/696; 257/704; 257/729; 257/730; 257/758; 257/774; 257/776; 257/786
[58] Field of Search ............. 257/684, 687, 688, 689, 257/690, 692, 693, 698, 700, 696, 701, 704, 723, 724, 725, 728, 729, 730, 750, 753, 758, 773, 774, 776, 786

[56] References Cited

U.S. PATENT DOCUMENTS

| | | |
|---|---|---|
| 3,781,596 | 12/1973 | Galli et al. ............ 257/762 |
| 4,063,349 | 12/1977 | Passler et al. ......... 29/627 |
| 4,246,595 | 1/1981 | Noyori et al. ......... 257/774 |
| 4,392,151 | 7/1983 | Iwatani ................ 257/687 |
| 4,633,573 | 1/1987 | Scherer ................ 257/700 |
| 4,783,695 | 11/1988 | Eichelberger et al. .. 257/723 |
| 5,016,084 | 5/1991 | Nakao ................. 257/704 |
| 5,049,980 | 9/1991 | Saito et al. .......... 257/724 |

FOREIGN PATENT DOCUMENTS

| | | |
|---|---|---|
| 0029858 | 6/1981 | European Pat. Off. . |
| 0069985 | 1/1983 | European Pat. Off. . |
| 0122687 | 10/1984 | European Pat. Off. . |
| 0130571 | 9/1985 | European Pat. Off. . |
| 0242295A | 10/1987 | European Pat. Off. . |
| 2179790 | 8/1986 | United Kingdom . |
| 2199182A | 12/1986 | United Kingdom . |

Primary Examiner—Ngan Ngo
Attorney, Agent, or Firm—Geoffrey H. Krauss

[57] ABSTRACT

A high density interconnect structure is rendered suitable for the packaging of overlay sensitive chips by providing a cavity in the high density interconnect structure which spaces the sensitive surface of such chips from the overlying high density interconnect structure in a manner which prevents undesired interactions between the dielectric of the high density interconnect structure and the chip.

20 Claims, 5 Drawing Sheets

HIGH DENSITY INTERCONNECT STRUCTURE INCLUDING A CHAMBER

This application is a continuation of application Ser. No. 07/504,770, filed Apr. 5, 1990, now abandoned.

RELATED APPLICATIONS

The present invention is related to application Ser. No. 07/504,760, entitled, "A Building Block Approach to Microwave Modules", by W. P. Kornrumpf, et al., application Ser. No. 07/504,821, entitled, HDI Microwave Circuit Assembly", by W. P. Kornrumpf, et al., now abandoned in favor of continuation application Ser. No. 07/869,090, filed Apr. 14, 1992, and application Serial No. 07/504,803, entitled, "Microwave Component Test Method and Apparatus", by W. P. Kornrumpf, et al., each of which is being filed concurrently herewith and each of which is incorporated herein by reference in its entirety.

BACKGROUND OF THE INVENTION

Field of the Invention

The present invention relates to the field of high density interconnect structures, and more particularly, to high density interconnect structures suitable for packaging microwave and other overlay sensitive components.

BACKGROUND INFORMATION

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths, resulting in variable inductances and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2 GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

In digital systems, individual chips can be extensively tested using wafer probe and other test systems before being committed to assembly into individual packages. After packaging, they can be further tested prior to assembly into a system. As a result, yield at system assembly is normally quite high. It is this assurance of successful assembly of digital components into an operative final system which has made feasible the provision of microcomputers and other digital systems at cost-for-performance prices which were unimaginable a decade ago.

Such pre-packaging has been impossible with active microwave devices because the losses and other penalties which packaging introduces are worse than the disease packaging would be intended to cure. Consequently, for microwave systems, post-packaging testing is not available at a component level as a final-assembly-yield-enhancement mechanism. Even full testing of components at a wafer level is not normally feasible because of the relatively large probe which is needed to provide an impedance match to the MMICs or other devices under test. However, the problem of low final yield has led to the design of some active microwave components for testing with so-called co-planar probe such as those built by Cascade Microtech. This requires that the chips be made over-sized in order to provide space on their upper surface for a microwave port having a signal conductor in the middle and two true ground conductors symmetrically disposed on opposite sides of that signal conductor. This structure is required for a co-planar probe to be connected to this microwave port in a well-matched, repeatable manner. The provision of a true ground on the upper surface of a microwave chip is not a simple matter at microwave frequencies (unlike the situation with digital chips which typically operate at frequencies of less than 50 MHz). Generally, this requires the use of a metal connection between the front and back surfaces of the chip. Such metal connections can be provided by plated through holes, but the provision of plated through holes increases the complexity of the fabrication process and decreases yield. Even those chips which are designed for co-planar probing cannot be tested at full power across their full operative range with a co-planar probe because of the poor thermal conductivity of MMICs. Consequently, design of a microwave device for co-planar probing has its own associated penalties such as increased size, increased process complexity, lower process yield and still suffers from a lack of complete assurance that test results will correlate with system performance.

A significant problem with the low yield of fully assembled systems is that such structures cannot be effectively reworked to replace faulty components because the component's connections cannot be removed in a non-destructive manner. Consequently, systems which are out of specification when assembled must be scrapped. Alternatively, if the microwave module is designed to allow rework, rework-induced damage is common, with a consequent limited reworked-induced increase in yield.

Thus, there is a continuing need for a microwave fabrication process which enables passive components to be fabricated with highly repeatable characteristics and which enables pre-testing of active devices and/or the removal and replacement of faulty components without impairing any good components when a system fails to meet specifications.

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 25–100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom must be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane. Thereafter, a polyimide film which may be Kapton ® polyimide, available from E. I. du Pont de Nemours Company, which is about 0.0005–0.003 inch (12.5–75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a which is scanned relative to the substrate laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Patent No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al., abandoned in favor of continuation application Ser. No. 07/644,716, filed Jan. 23, 1991, now U.S. Pat. No. 5,154,793; U.S. patent application Ser. No. 310,149, filed Feb. 14, 1989, entitled "Laser Beam Scanning Method for Forming Via Holes in Polymer Materials" by C. W. Eichelberger, et al., now U.S. Pat. No. 4,894,115; U.S. patent application Ser. No. 312,798, filed Feb. 21, 1989, entitled "High Density Interconnect Thermoplastic Die Attach Material and Solvent Die Attachment Processing" by R. J. Wojnarowski, et al., abandoned in favor of continuation application Ser. No. 07/745,982, filed Aug. 5, 1991; U.S. patent application Ser. No. 283,095, filed Dec. 12, 1988, entitled "Simplified Method for Repair of High Density Interconnect Circuits" by C. W. Eichelberger, et al., now U.S. Pat. No. 4,878,991; U.S. patent application Ser. No. 305,314, filed Feb. 3, 1989, entitled "Fabrication Process and Integrated Circuit Test Structure" by H. S. Cole, et al., and now abandoned; U.S. patent application Ser. No. 250,010, filed Sep. 27, 1988, entitled "High Density Interconnect With High Volumetric Efficiency" by C. W. Eichelberger, et al., now U.S. Pat. No. 5,019,946; U.S. patent application Ser. No. 329,478, filed Mar. 28, 1989, entitled "Die Attachment Method for Use in High Density Interconnected Assemblies" by R. J. Wojnarowski, et al., now U.S. Pat. No. 5,019,535; U.S. patent application Ser. No. 253,020, filed Oct. 4, 1988, entitled "Laser Interconnect Process" by H. S. Cole, et al., now U.S. Pat. No. 4,960,613; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al., now U.S. Pat. No. 4,884,122; U.S. patent application Ser. No. 233,965, filed Aug. 8, 1988, entitled "Direct Deposition of Metal Patterns for Use in Integrated Circuit Devices" by Y. S. Liu, et al., and now abandoned; U.S. patent application Ser. No. 237,638, filed Aug. 23, 1988, entitled "Method for Photopatterning Metallization Via UV Laser Ablation of the Activator" by Y. S. Liu, et al., now U.S. Pat. No. 4,882,200; U.S. patent application Ser. No. 237,685, filed Aug. 25, 1988, entitled "Direct Writing of Refractory Metal Lines for Use in Integrated Circuit Devices" by Y. S. Liu, et al., and now abandoned; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al., now U.S. Pat. No. 4,933,042; U.S. patent application Ser. No. 342,153, filed Apr. 24, 1989, entitled "Method of Processing Siloxane-Polyimides for Electronic Packaging Applications" by H. S. Cole, et al., now U.S. Pat. No. 4,897,153; U.S. patent application Ser. No. 289,944, filed Dec. 27, 1988, entitled "Selective Electrolytic Deposition on Conductive and Non-Conductive Substrates" by Y. S. Liu, et al., now U.S. Pat. No. 4,988,412; U.S. patent application Ser. No. 312,536, filed Feb. 17, 1989, entitled "Method of Bonding a Thermoset Film to a Thermoplastic Material to Form a Bondable Laminate" by R. J. Wojnarowski, and now abandoned; U.S. patent application Ser. No. 363,646, filed Jun. 8, 1989, entitled "Integrated Circuit Packaging Configuration for Rapid Customized Design and Unique Test Capability" by C. W. Eichelberger, et al., abandoned in favor of continuation application Ser. No. 07/784,094, filed Oct. 28, 1991; U.S. patent application Ser. No. 07/459,844, filed Jan. 2, 1990, entitled "Area-Selective Metallization Process" by H. S. Cole, et al., now U.S. Pat. No. 5,127,998; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al., now U.S. Pat. No. 5,169,678; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al., now U.S. Pat. No. 5,040,049; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al., and now abandoned. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line, other wave impedance matching and dielectric loading effects have not needed to be considered.

The interconnection of microwave structures or devices intended to operate at GHz frequencies presents many problems, considerations and challenges not faced in the interconnection of digital systems which operate at frequencies of less than 50 MHz. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

Because of the low yield of finally assembled microwave systems, such systems are quite expensive both because of ultimate component cost and because the fabrication process is more akin to engineering than to semiconductor fabrication techniques. In order to increase the yield of final systems and to reduce their cost to the point where they become feasible for use in everyday systems, there is a need for a technique for packaging individual microwave components and subsystems in an efficient, high yield manner which enables such components and subsystems to be assembled into final systems with a high yield.

The related application Ser. No. 07/869,090, entitled, "High Density Interconnected Microwave Circuit Assembly" overcomes the problems of reworkability and poor passive component tolerances of the prior art thin and thick film microwave system assembly methods whereby if a microwave system, when assembled does not meet specifications, it can be disassembled for removal of faulty components and reassembled without danger to good components. This application also teaches removing the high density interconnect dielectric from portions of the chip which are overlay sensitive. By overlay sensitive, we mean that the operating characteristics of the device or component are different when the device or component is free of interconnection dielectric material than they are when the high density interconnect dielectric is disposed on the chip or structure or at least on overlay-sensitive portions of the chip or structure.

Related application Ser. No. 07/504,760, entitled, "A Building Block Approach to Microwave Modules" provides a solution to the problem of packaging microwave components in an efficient, reliable, high yield manner which makes the assembly of a microwave system from prepackaged components attractive and desirable, both from an efficiency and yield point of view.

Related application Ser. No. 07/504,803, entitled, "Microwave Component Test Method and Apparatus" provides a solution to the problem of testing microwave components in an efficient, high correlation manner without significant risk to the components.

Unfortunately, the techniques disclosed in Ser. Nos. 07/869,090 and 07/504,760 while providing the advantage of enabling microwave components to be packaged with the high density interconnect structure, suffer from the disadvantage that the need to exclude the high density interconnect structure dielectric layer from the surface of overlay-sensitive microwave components severely restricts the surface area available for the routing of high density interconnect structure conductors since they cannot be routed over the area from which the dielectric layer is to be removed. Where chips are closely packed for maximum density, this essentially limits the high density interconnect structure to the routing of conductors in the streets and avenues portion of the structure which extends from the contact pads of one chip to the contact pads of the adjacent chip. For systems in which relatively low interconnection density is required, this limitation can be accommodated without serious impact on the system structure or operation. However, where a high density of interconnect conductors is required, such a restriction can make a system unroutable or require excessive numbers of layers of interconnect conductors or can require that the chips to be spaced further apart than would otherwise be necessary, just for the purpose of widening the streets and avenues to accommodate the required quantity of interconnect conductors.

Digital systems which are designed with very small features and/or which are designed to operate at frequencies in the GHz range can be sensitive to the presence of a dielectric layer thereover, even when they are not in the normal sense microwave circuits in that they do not employ transmission lines and analog techniques. In such very high frequency digital systems, there is a need for a high density of interconnections which is similar to that need in such systems which operate in the 50 MHz and less frequency range. Removing the dielectric layer over the center of the chips severely restricts the available routing area.

Accordingly, there is a need for a high density interconnect structure which accommodates the overlay sensitivity of many components without sacrificing the routing density of the high density interconnect structure.

OBJECTS OF THE INVENTION

Accordingly, a primary object of the present invention is to enable the high density interconnect process to be used with very high frequency systems without incurring circuit density penalties due to the necessity for excluding the polymer dielectric layers from active die areas.

Another object of the present invention is to facilitate the removal of the high density interconnect structure dielectric layers from over the active areas of high frequency chips without introducing detrimental effects on the chip operating characteristics.

Another object of the present invention is to allow use of high density interconnect structures with camera or line array technologies that need the active area of the device clear of any impediments to clear, unattenuated vision.

SUMMARY OF THE INVENTION

The above and other objects which will become apparent from the specification as a whole, including the drawings, are accomplished in accordance with the present invention by elevating the dielectric of an high density interconnect structure above the active area of a chip. In one embodiment, this creates a chamber over the active portion of a chip where the chip is overlay-sensitive. This prevents undesired, adverse interactions between a high density interconnect structure and the overlay-sensitive chip.

In accordance with one embodiment of the invention, a chip is disposed in a cavity in a substrate which is deeper than the chip is thick. A first dielectric layer of a high density interconnect structure is laminated to plateau portions of the substrate's upper surface and during the lamination process is forced to sag into the cavity where it is bonded to the exposed surface of the chip. A patterned first layer of metallization is supported by this dielectric layer and extends from ohmic contacts with the contact pads of the chip to over the plateau portion of the substrate's upper surface. The first layer of dielectric material is removed from any overlay sensitive portions of the chip. Thereafter, a second dielectric layer of the high density interconnect structure is laminated onto the first layer of dielectric material and the first layer of metallization. During the lamination process, this second dielectric layer is stretched taut enough that it does not sag into contact with the chip or portions of the first dielectric layer which extend downward into the recess in which the chip is located. A second layer of metallization (in a normal pattern of high density interconnect structure) is disposed on the second dielectric layer. The conductors of the second metallization layer may extend across the chip without adversely affecting its operating characteristics even if the chip is overlay sensitive because of the gap between the second dielectric layer and the active portion of the chip which is provided by the chamber. More than one chip may be disposed in a cavity and there may be more than one such cavity in the structure. In a structure, some chips may have the dielectric layer thereover elevated, while others do not.

This structure may be fabricated in a variety of ways. The second, taut dielectric layer may be provided by stretching a preformed dielectric layer on a frame to hold it taut during lamination. Alternatively, the second dielectric layer may be pre-bonded to a rigid support, such as a metal backing layer, to prevent it from sagging during the bonding process. To aid in the prevention of sagging, a fluid conduit port may be provided in the substrate to equalize pressure within the chamber in which the chip is disposed and the lamination pressure during the lamination process.

The atmosphere within the chamber may be controlled by evacuating the chamber of the final structure or introducing selected fluids (gas or liquid), into the chamber through the pressure equalization conduit. If desired, the conduit may be configured to provide for a continuous flow of gas or liquid through the chamber for cooling or other purposes.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 2-5 illustrate successive stages in the fabrication of the FIG. 1 structure.

DETAILED DESCRIPTION

Figure 1:
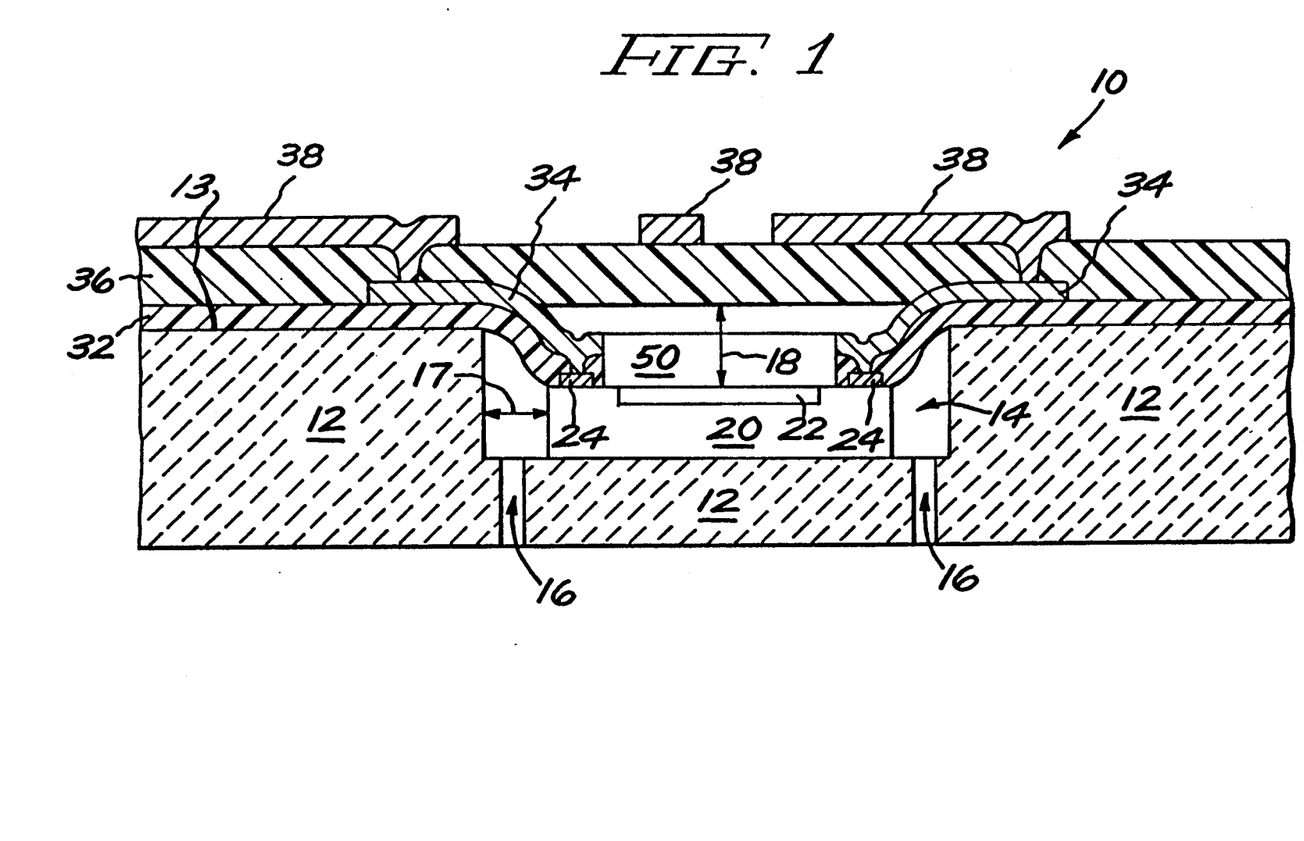
FIG. 1 is a cross-section illustration of a portion of a system, including a chamber, in accordance with the present invention.

In FIG. 1, a portion of a system 10, in accordance with the present invention, is illustrated in a cross-section view. The system 10 comprises a substrate 12, which may preferably be ceramic, but may be metal or other material provided the thermal coefficient of expansion of the substrate and the chip mounted thereon are sufficiently matched. The substrate 12 includes a cavity 14 in which a semiconductor chip or other electronic component 20 is mounted. Two fluid conduits 16 communicate with the cavity 14 from the back side of the substrate. The semiconductor or other chip 20 is preferably secured in the chamber by a layer of thermoplastic (not shown). The chip 20 has an active area 22 at its upper surface and a plurality of contact pads 24 disposed on that upper surface along the periphery of that surface. A first HDI dielectric layer 32 is bonded to a plateau portion 13 of the upper surface of the substrate 12 and to the upper surface of the chip 20. A window 50 in the dielectric layer 32 is disposed over the active area of the chip. No dielectric material is disposed within the window 50. A plurality of conductors 34 are disposed on the dielectric layer 32 and extend into via holes in the dielectric layer which are disposed in alignment with the contact pads 24. Conductors 34 then extend over the plateau portion 13 of the substrate surface. This interconnection structure includes unique features when it is fabricated (as taught in the background patents and applications) by first bonding the dielectric layer to the underlying structure, then forming the via holes in the dielectric by laser "drilling" from above and then depositing the metal of the conductors 34 over the dielectric and in the via holes where it makes ohmic contact to the underlying contact pad or other metallization. In particular, the external configuration of the metal in the via hole takes on the shape of the via hole, rather than vice versa as would be the case if the metal were formed first and the dielectric filled in around it. The nature of the laser drilling process, which is used to form the via holes by drilling from the top, typically results in a via hole which is wider at the top than at the bottom. This via hole shape provides improved metal continuity between the portion of a conductor which is disposed at the bottom of a via hole and the portion which is outside the via hole. This is because the via hole wall surface on which the metal is deposited has a sloping-upward-and-outward configuration which is known from the semiconductor arts to result in a deposited metallization layer achieving better step coverage than is achieved where the step has a vertical wall surface. The term step coverage refers to the uniformity of the metal coverage where the deposition surface changes levels from one planar surface area (the bottom of the via hole) to another planar surface area (the top of the dielectric layer). When the conductors are formed in accordance with the preferred manner described in the background Patents and Patent Applications, the upper surface of the metal conductor typically has a depression or dimple in it at the via hole because the metal of the conductors is deposited to a substantially uniform thickness everywhere, including in the via holes (which are not filled prior to deposition of the metal across the planar surface of the dielectric layer). Consequently, the surface topology of the metallization is similar to the surface topology of the layer on which it is deposited.

The conductors 34 serve primarily to bring the contact pads 24 onto the plateau surface 13 for the connection of subsequent high density interconnect layers. In addition, interconnecting conductors may be run in this layer over the plateau portion of the substrate. This is particularly advantageous where including routed conductors in this layer eliminates a need for an extra interconnection layer in the overall structure.

A window 50 in the dielectric layer 32 encompasses the active area 22 of the chip 20. A second dielectric layer 36 spans the chip containing cavity to form a chamber 18 whose ceiling is spaced from or elevated above the active portion 22 of the chip 20 by a gap whose height is selected in accordance with the operating characteristics and the degree of sensitivity of the chip 20 and is determined by the depth of the cavity 14 relative to the height of the chip. This gap may preferably be from 1 to 12 mils high. A plurality of high density interconnect conductors 38 are disposed on the upper surface of the dielectric layer 36 and extend into via holes in the dielectric layer 36 in alignment with conductors 34 as is appropriate for the desired interconnection pattern to the overall system. The conductor runs 38 may extend across the active area 22 of the chip 20 without producing adverse affect on the operating characteristics of the chip 20 because the chamber 18 is sufficiently tall as to place the dielectric layer 36 and the conductors 38 disposed on it upper surface further from the upper surface of the chip 20 than is required in order to substantially prevent interactions between the dielectric layer 36 and the operating characteristics of the component 20.

Figure 2:
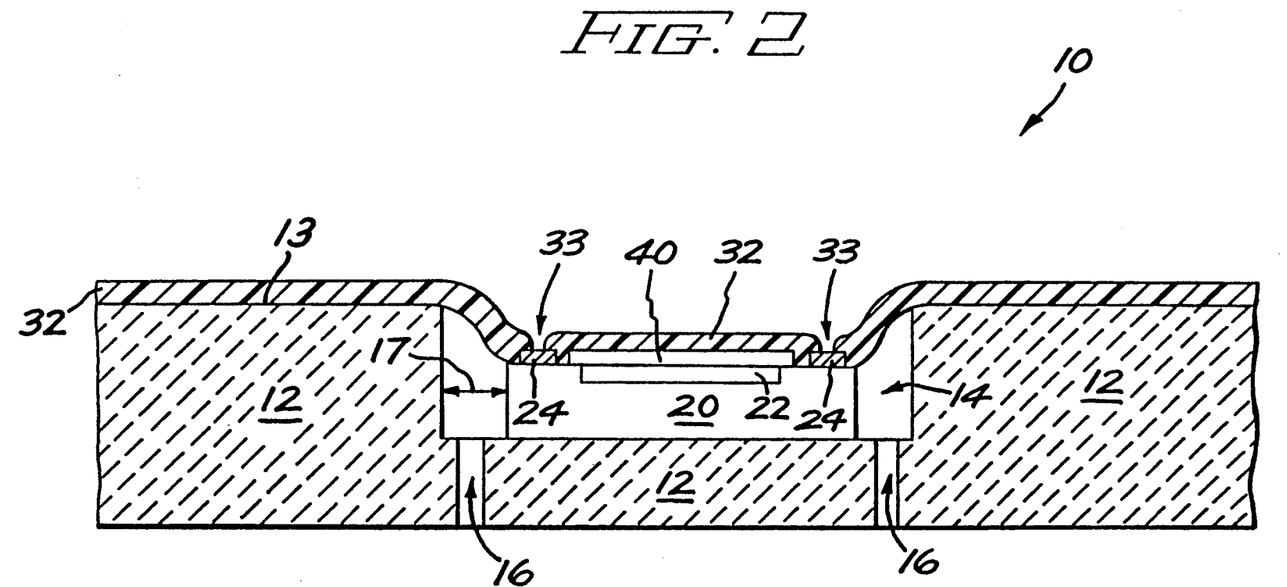

A first stage in the fabrication of the system 10 of FIG. 1 is illustrated in cross-section in FIG. 2. In FIG. 2, the first dielectric layer 32 has been disposed on top of the substrate 12 and the chip 20. Also disposed on the chip 20 in a manner to span its active or at least its overlay-sensitive portion, is a layer of dielectric 40 which is slightly larger than the active area 22 of the chip 20. This dielectric layer may be Kapton or Teflon, as may be considered desirable. In any event, the layer 40 is preferably not bonded to the chip 20, but instead is merely physically placed on its surface. The dielectric layer 32 is then laminated over the chip, the dielectric layer 40 and the substrate 12. In performing this lamination, a pressure difference is provided between the cavity 14 and the lamination pressure source which forces the Kapton layer into intimate contact with the plateau portion 13 of the substrate's upper surface and the upper surface of the chip.

Following this lamination process, via holes 33 are laser drilled in the dielectric layer 32. A pattern of conductors 34 is then formed on the surface of the dielectric layer 32 with appropriate conductors 34 extending into the via holes and into ohmic contact with the contact pads 34 of the chip, as shown in FIG. 3. All the conductors 34 extend from the via holes 33 on the chip 20 to over the plateau portion 13 of the substrate surface.

Figure 4:
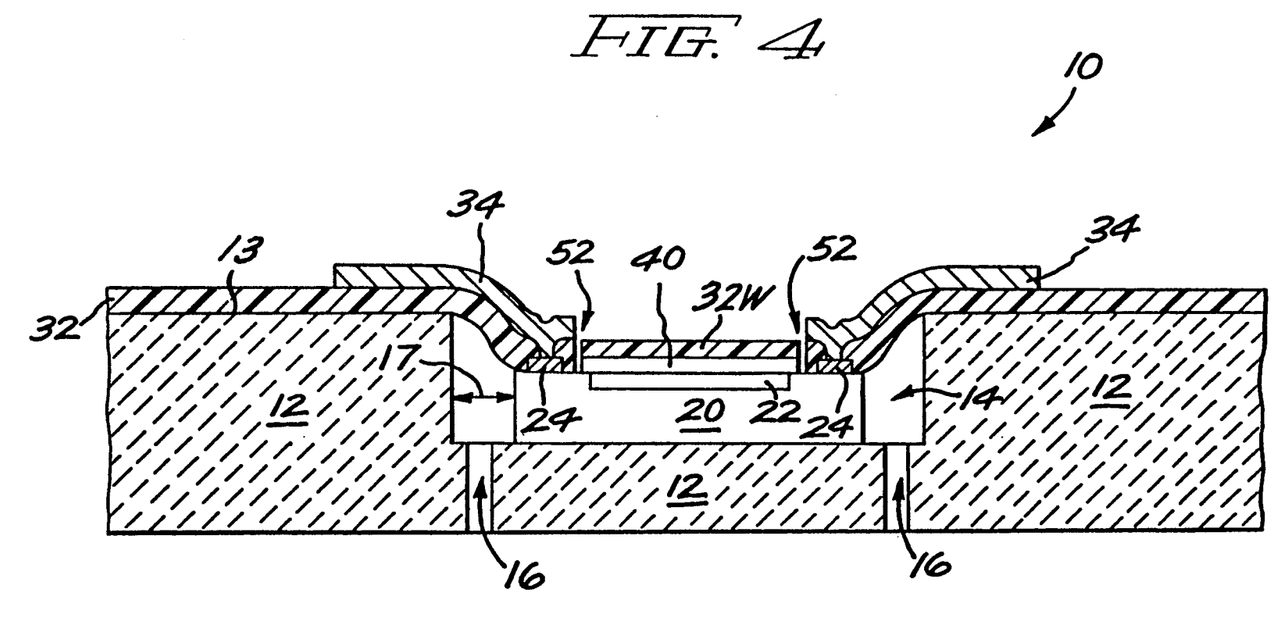

As shown in FIG. 4, the dielectric layer 32 is then laser cut around the periphery of the dielectric layer 40 to form a kerf 52 to facilitate removal of the portion 32W of this dielectric layer which is disposed over the overlay-sensitive portion of the chip 20.

Figure 5:
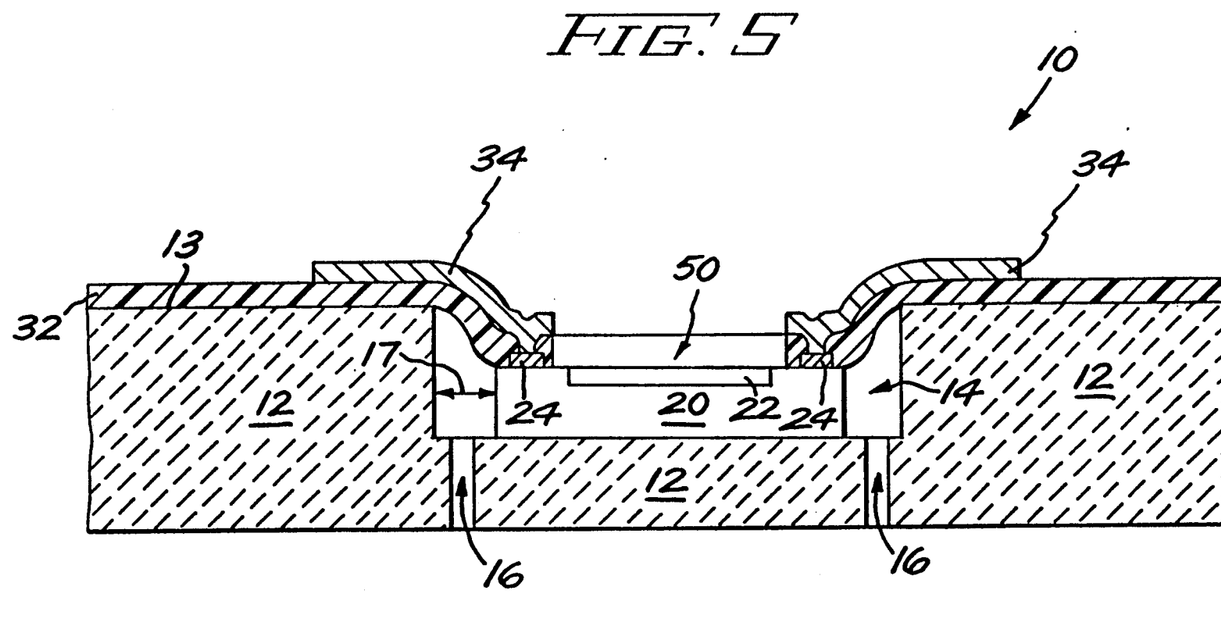

In FIG. 5, the structure is illustrated after removal of the cut or window portion 32W of the dielectric layer along with the dielectric layer 40 to which it is bonded. This leaves a window 50 which is free of high density interconnect structure dielectric. The window 50 encompasses the active area 22 of the chip. Next, the second layer 36 of dielectric material is laminated over the structure, via holes are drilled therein and metal conductors 38 are patterned thereon, to yield the structure shown in FIG. 1.

During the lamination of the first dielectric layer 32 onto the substrate 12 and the chip 20, the conduits 16 are preferably connected to a vacuum system to assist in shaping the dielectric layer 32 into a configuration which bonds to the surface of the chip 20 and bridges the gap 17 between the upper surface of the chip 20 and the plateau portion of the substrate 16. During the lamination of the second dielectric layer 36, a positive pressure may be introduced into the cavity 18 through the conduits 16 to prevent sagging of the second dielectric layer 36 into the chamber 18 during the application of lamination pressure to that dielectric layer.

In a typical high density interconnect structure, as described in the background patents and applications, the portion of the cavity 14 disposed below the dielectric layer 32 is sealed from the atmosphere above the dielectric layer 32 by the tight lamination of the layer 32. Such sealing would interfere with the use of a positive pressure in the chamber 18 to hold up the ceiling of the chamber during lamination. Consequently, if it is desired to apply positive pressure to the chamber 18 during lamination or other at other times, it is preferred to laser drill appropriate holes in the dielectric layer 32 prior to laminating the second dielectric layer 36 to the structure. This laser drilling is preferably done after the deposition and patterning of the conductor runs 34, so that no further liquid processing is done after drilling the holes and prior to lamination of the second dielectric layer 36. This prevents liquid processing solutions from entering the cavity and becoming trapped because of the presence of the first dielectric layer 32.

If desired, the dielectric layer 36 may be pulled taut and bonded to a rigid backing prior to placing the layer 32. Lamination pressure is then applied to the rigid backing to bond the dielectric layer 36 to the exposed portions of the dielectric layer 32 and the conductors 34 in a manner which prevents sagging of that dielectric layer. This rigid backing material may preferably be aluminum or another metal which may be etched or dissolved from the surface of the dielectric layer 36 following the completion of the lamination process.

As an alternative to the use of the Teflon layer 40 to enable removal of the dielectric layer 32 from the active portion of the chip 20 without adversely affecting the active portion of the chip 20, a soluble, but non-laser ablatable adhesive layer may be disposed over the active portion of the chip 20 prior to the application of the laser ablatable thermoplastic adhesive which laminates the layer 32 to the upper surface of the substrate and the chip. In this manner, the laser ablatable dielectric disposed over the active portion of the chip may be removed by laser ablation in which the laser scanned across the active area of the chip 20 in an appropriate pattern to laser ablate substantially all of the laser ablatable portion of the dielectric layer 32. Thereafter, the exposed portion of the non-laser ablatable thermoplastic adhesive may be removed by dissolving it in an appropriate solvent either by immersing the system 10 in that solvent or by spraying that solvent on the exposed surface of the high density interconnect structure to dissolve the exposed soluble adhesive. This avoids any need to use a plasma etch to remove laser ablation debris from the chip's surface. (The surface of the HDI structure can be plasma cleaned prior to dissolving the non-ablatable adhesive.)

A typical microwave active component is fabricated in gallium arsenide. Gallium arsenide has a thermal conductivity which is roughly one-third that of silicon. Consequently, heat generated in the active devices on the gallium arsenide is not easily conducted through the gallium arsenide to the substrate 12. Consequently, it may be found desirable to connect the pressure equalization conduits 16 to an appropriate cooling system which is suitable for inducing a flow of a gaseous or liquid coolant through the chamber 18 in order to aid in the heat removal process. Alternatively, rather than passing the fluid cooling agent through the chamber on a continuous basis, an appropriate atmosphere may be maintained in the chamber to aid in conduction of heat from the chip or to establish a desired relative dielectric constant therein.

While in a high density interconnect structure the dielectric layer 36 is normally continuous and substantially impervious, the dielectric layer 36 may have apertures formed therein in its ceiling portion in order that the chamber 18 will not be a sealed chamber or for other purposes, such as admitting ultraviolet or infrared light into the chamber 18 without it being attenuated by passing through the dielectric layer 36 which may be highly absorptive to specific portions of the electromagnetic spectrum, including the ultraviolet and infrared portions.

The chamber 18 is preferably vacant where the chip 20 is particularly sensitive to any increase in the relative dielectric constant of the material adjacent its surface. The term "vacant" is used in this connection to include the presence of a vacuum in the chamber 18 and the presence of a gaseous atmosphere. The chamber 18 may also be referred to as a low dielectric constant chamber because of the presence of a fluid therein rather than a solid. In this broad sense, a fluid includes liquid, gasses and vacuum which is effectively a very low density gas.

While the one particular embodiment of the present invention is illustrated in the figures, it will be recognized that many variations may be made in this structure such as including multiple chips in a single cavity, including multiple separate chambers in an high density interconnect structure, including a combination of chips having the high density interconnect dielectric elevated thereover and chips having the high density interconnect dielectric disposed in contact with the entire upper surface of the chip.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a high density interconnected system including at least one electronic chip having an upper surface defining a plane, a high density interconnect (HDI) structure including a first dielectric layer of dielectric material bonded to said chip and a first pattern of HDI conductors disposed on or in said dielectric material, the conductors of said HDI interconnect structure electrically connected to said electronic chip, the improvement comprising:

said HDI structure including an overlying layer overlying said chip, said overlying layer spanning said chip and being spaced from said upper surface of said chip whereby a portion of said overlying layer comprises a ceiling of a chamber which is disposed between said chip and said overlying layer, said overlying layer defining a plane;

said first dielectric layer of said HDI structure including a portion disposed at an angle to the plane of said overlying layer and extending from said overlying layer to said upper surface of said chip, said first dielectric layer of the HDI structure being bonded to both said overlying layer and to said upper surface of said chip;

said first pattern of HDI conductors being disposed on said first dielectric layer of said HDI structure and including conductors which extend from an ohmic contact with a contact pad of said chip to said overlying layer;

said overlying layer comprising (a) a second dielectric layer of said HDI structure; and (b) a second pattern of HDI conductors disposed on said second dielectric layer, at least some conductors of said second pattern of conductors being ohmically connected to conductors of said first pattern of conductors.

2. The improvement recited in claim 1 wherein:
said at least some conductors of said second pattern of conductors are ohmically connected to said conductors of said first pattern of conductors where those conductors of said first pattern are spaced from the plane of the upper surface of said chip.

3. The improvement recited in claim 2 wherein said second pattern of conductors includes conductors which extend over a ceiling portion of a chamber which is disposed between said chip and said second dielectric layer.

4. The improvement recited in claim 1 wherein:
said chip is an overlay-sensitive chip whose upper surface includes an overlay-sensitive portion.

5. The improvement recited in claim 4 wherein:
said overlay-sensitive portion of said overlay-sensitive chip is free of high density interconnect dielectric material.

6. The improvement recited in claim 5 wherein:
said overlay-sensitive portion of said overlay-sensitive chip is spaced at least 1 mil from any dielectric material of said high density interconnect structure which extends into alignment with said overlay-sensitive portion of said upper surface of said overlay-sensitive chip.

7. The improvement recited in claim 6 wherein:
said overlay-sensitive portion of said overlay-sensitive chip is spaced between 1 and 12 mils from any dielectric material of said high density interconnect structure which extends into alignment with said overlay-sensitive portion of said upper surface of said overlay-sensitive chip.

8. The improvement recited in claim 6 wherein:
said overlying layer comprises a second dielectric layer of said high density interconnect structure, said second dielectric layer being bonded to portions of said first dielectric layer, said second dielectric layer spanning said chip and being spaced from said upper surface thereof whereby a portion of said second dielectric layer comprises a ceiling of a chamber which is disposed between said chip and said second dielectric layer.

9. The improvement recited in claim 1 wherein:
said at least some conductors of said second pattern of conductors are ohmically connected to said conductors of said first pattern of conductors where those conductors of said first pattern are spaced from the plane of the upper surface of said chip.

10. The improvement recited in claim 9 wherein said second pattern of conductors includes conductors which extend over a ceiling portion of a chamber which is disposed between said chip and said second dielectric layer.

11. The improvement recited in claim 1 wherein:
said system includes a substrate having a cavity which is deeper than a thickness of said chip; and
said chip is disposed in said cavity, whereby said upper surface of said chip is recessed relative to a plateau portion of the upper surface of said substrate.

12. The improvement recited in claim 11 wherein:
a portion of said first dielectric layer of the high density interconnect structure is bonded to said plateau portion of said substrate upper surface.

13. The improvement recited in claim 11 wherein:
said substrate includes a fluid conduit disposed in communication with said cavity.

14. The improvement recited in claim 13 wherein:
conduit is configured to enable a fluid flow to be established through said chamber.

15. The improvement recited in claim 1 wherein:
said system includes a substrate having a cavity which is deeper than a thickness of said chip; and
said chip is disposed in said cavity, whereby said upper surface of said chip is recessed relative to a plateau portion of the upper surface of said substrate.

16. The improvement recited in claim 15 wherein:
a portion of said first dielectric layer of the high density interconnect structure is bonded to said plateau portion of said substrate upper surface.

17. The improvement recited in claim 16 wherein:
said at least some conductors of said second pattern of conductors are ohmically connected to said conductors of said first pattern of conductors over said plateau portion of said upper surface of said substrate.

18. The improvement recited in claim 16 wherein:
some conductors of said second pattern of HDI conductors are disposed on or in said ceiling portion of said high density interconnect structure.

19. The improvement recited in claim 18 wherein some conductors of said second layer of high density interconnect conductors extend over said chip.

20. The improvement recited in claim 1 wherein:
said chamber is vacant.

* * * * *